United States Patent
Byran et al.

(10) Patent No.: US 7,103,131 B1
(45) Date of Patent: Sep. 5, 2006

(54) SYSTEM AND METHOD FOR HALF-RATE CLOCK PHASE DETECTION

(75) Inventors: Thomas Clark Byran, San Diego, CA (US); Hongwen Lu, San Diego, CA (US); Wei Fu, San Diego, CA (US)

(73) Assignee: Applied Micro Circuits Corporation (AMCC), San Diego, CA (US)

( * ) Notice: Subject to any disclaimer, the term of this patent is extended or adjusted under 35 U.S.C. 154(b) by 891 days.

(21) Appl. No.: 10/218,804

(22) Filed: Aug. 14, 2002

(51) Int. Cl.
*H03D 3/24* (2006.01)
(52) U.S. Cl. ........................................ 375/375
(58) Field of Classification Search .............. 375/375, 375/371, 376
See application file for complete search history.

(56) References Cited

U.S. PATENT DOCUMENTS 6,771,728 B1 *  8/2004  Abernathy ............... 375/371
6,970,020 B1 * 11/2005  Mei et al. ................ 327/3
2004/0012414 A1 *  1/2004  Chen et al. ............... 327/2

* cited by examiner

*Primary Examiner*—Chieh M. Fan
*Assistant Examiner*—Jia Lu
(74) *Attorney, Agent, or Firm*—Law Office of Gerald Maliszewski; Gerald Maliszewski

(57) ABSTRACT

A system and method for half-rate phase detecting are provided. The method comprises: receiving binary data; dividing the data by two; latching the divided data with a first half-rate clock, creating Q1; latching the divided data with a second half-rate clock, the inverse of the first clock, creating Q2; latching Q1 with the second clock, creating Q3; latching Q2 with the first clock, creating Q4; XORing Q1 and Q2 to create phase signals; and, XORing Q3 and Q4 to create reference signals, corresponding to the phase signals. In some aspects of the method, dividing the stream of data by two introduces a processing delay into the divided data. Then, the method further comprises: in response to the phase and reference signals, phase-locking a voltage controlled oscillator to generate the first and second clocks; delaying the received stream of binary data; and, using the first and second clocks to sample the delayed binary data.

13 Claims, 5 Drawing Sheets

SYSTEM AND METHOD FOR HALF-RATE CLOCK PHASE DETECTION

BACKGROUND OF THE INVENTION

1. Field of the Invention

This invention generally relates to serial bit receivers and, more particularly, to a system and method for using a half-rate clock phase detector to receive serial data and generate a data clock.

2. Description of the Related Art

In clock and data recovery (CDR) circuits, phase-locked loops (PLLs) are essential in recovering the received data clock, as well as retiming the data. Hogge phase detectors, or Hogge detector variants are often used for this purpose because of their simplicity and linear behavior. However, at very high data rates the pulse widths can become so narrow that cannot be handled properly by Hogge phase detector. Alternately stated, the propagation delays become larger than the pulse widths. Potential phase detection consequences include no zero-crossing, data pattern dependent zero-crossings offsets, or phase-voltage transfer curves with very narrow linear ranges.

Figure 1:
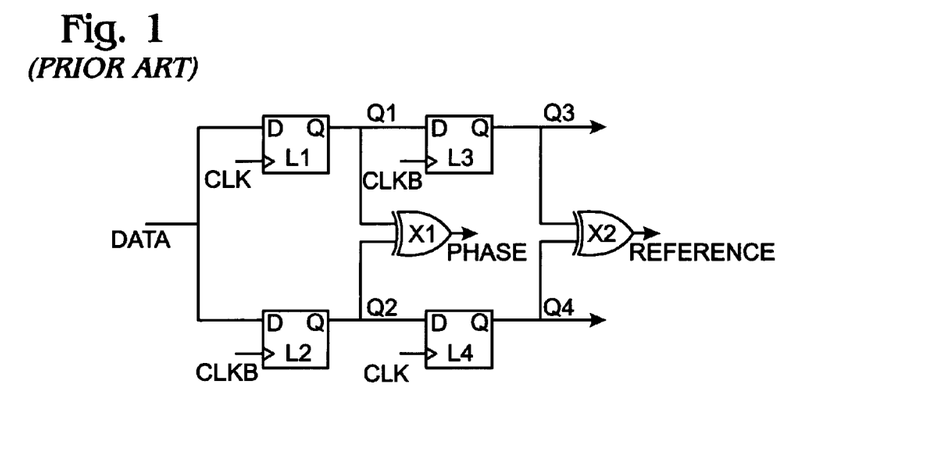
FIG. 1 is a schematic diagram of a simplified half-rate Hogge phase detector (prior art).

FIG. 1 is a schematic diagram of a simplified half-rate Hogge phase detector (prior art). The circuit consists of four latches, L1 to L4, forming two sets of flip-flops and two XOR gates, X1 and X2. For illustration purpose, all signal paths are shown single-ended (unbalanced). However, many applications use a differential implementation. The data is input to latches L1 and L2, and then retimed to output demultiplexed data Q1 and Q2. Those two flip-flops are driven by half-rate clocks CLK and CLKB, respectively. To provide phase and reference signals to a loop filter (not shown), that eventually controls a voltage controlled oscillator VCO (not shown), an exclusive-OR (XOR) operation is performed on output signals Q1 and Q2, Q3 and Q4 to obtain phase and reference signals.

Figure 2:
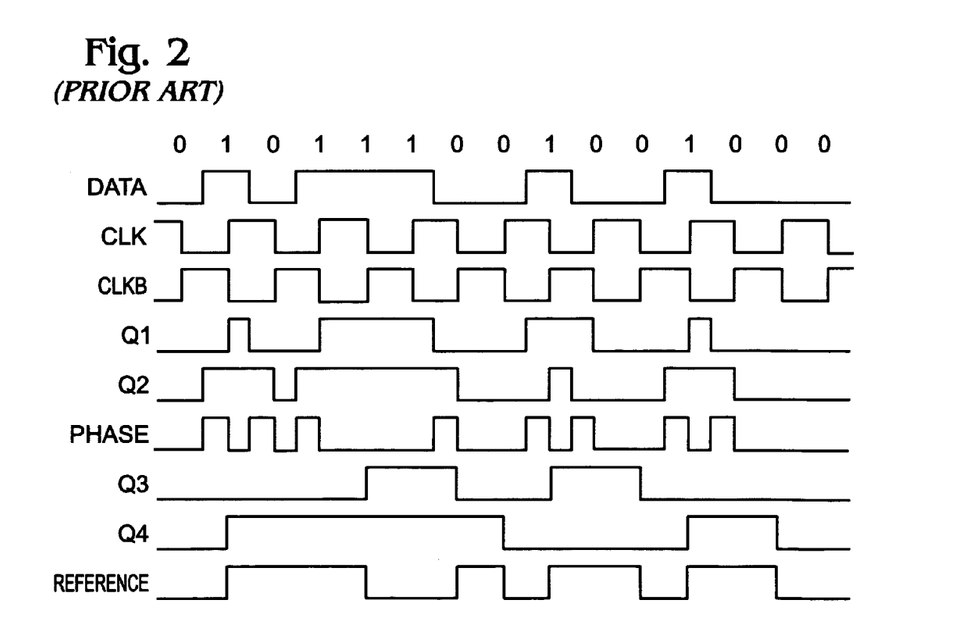
FIG. 2 is a timing diagram associated with the operation of the Hogge detector in FIG. 1 (prior art).

FIG. 2 is a timing diagram associated with the operation of the Hogge detector in FIG. 1 (prior art). When the VCO is locked, the phase signal pulses are only half as wide as the reference signal pulses. When locked, pulse width of Q1 and Q2 can only be half the period of the full-rate clock. At high data rates it may be difficult for the latches to output short pulses with full voltage swings. When relatively wide linear region of phase-voltage transfer curve are required, latches L1 and L2 must provide even shorter pulses. However, XOR gate X1 may be unable to handle especially short pulse widths.

These short pulses can cause a variety of problems. If the latches cannot generate pulse as wide as the width of half period full-rate clock, the loop phase detector (not shown) may have no zero crossing in its phase-voltage transfer curve. If latches can output such short pulses, but cannot reach full swing, then data pattern dependent zero-crossing offsets will occur. For example, the swing for a "1100" data pattern might be better than for a "1010" pattern. If latches can output short pulses with a full swing, but cannot output even shorter pulses, then the linear region of phase-voltage transfer curve may become too narrow. Therefore, performance of the phase detector is heavily dependent upon the latch performance.

It would be advantageous if the latches in a Hogge detector could be made to operate at a lower speed while supporting higher phase detector data rates.

SUMMARY OF THE INVENTION

The present invention provides a modified half-rate phase detector that is better able to handle high-frequency data, permitting an associated phase detector to operate at higher data rates. The present invention architecture significantly increases the output pulse widths of first two sampling latches, thus guaranteeing phase detector operation with a sufficient zero-crossing, small data dependent zero-crossing offsets, and wide linear region. Further, the present invention reference signal XOR design permits the sampling clock to be offset anywhere across the data eye, for different circuit applications.

Accordingly, a half-rate phase detecting method is provided. The method comprises: receiving a stream of binary data; dividing the data by two; latching the divided data with a first half-rate clock, creating a first latch output Q1; latching the divided data with a second half-rate clock, the inverse of the first clock, creating a second latch output Q2; latching Q1 with the second clock, creating a third latch output Q3; latching Q2 with the first clock, creating a fourth latch output Q4; performing an exclusive-OR operation on Q1 and Q2 to create phase signals; and, performing an exclusive-OR operation on Q3 and Q4 to create reference signals, corresponding to the phase signals.

In some aspects of the method, dividing the stream of data by two includes introducing a processing delay into the divided data. Then, the method further comprises: in response to the phase and reference signals, phase-locking a voltage controlled oscillator to generate the first and second clocks; delaying the received stream of binary data a period of time equal to the processing delay; and, using the first and second clocks to sample the delayed binary data.

Additional details of the above described method and a half-rate phase detector system with reduced data transition density are provided below.

DETAILED DESCRIPTION OF THE PREFERRED EMBODIMENTS

Figure 3:
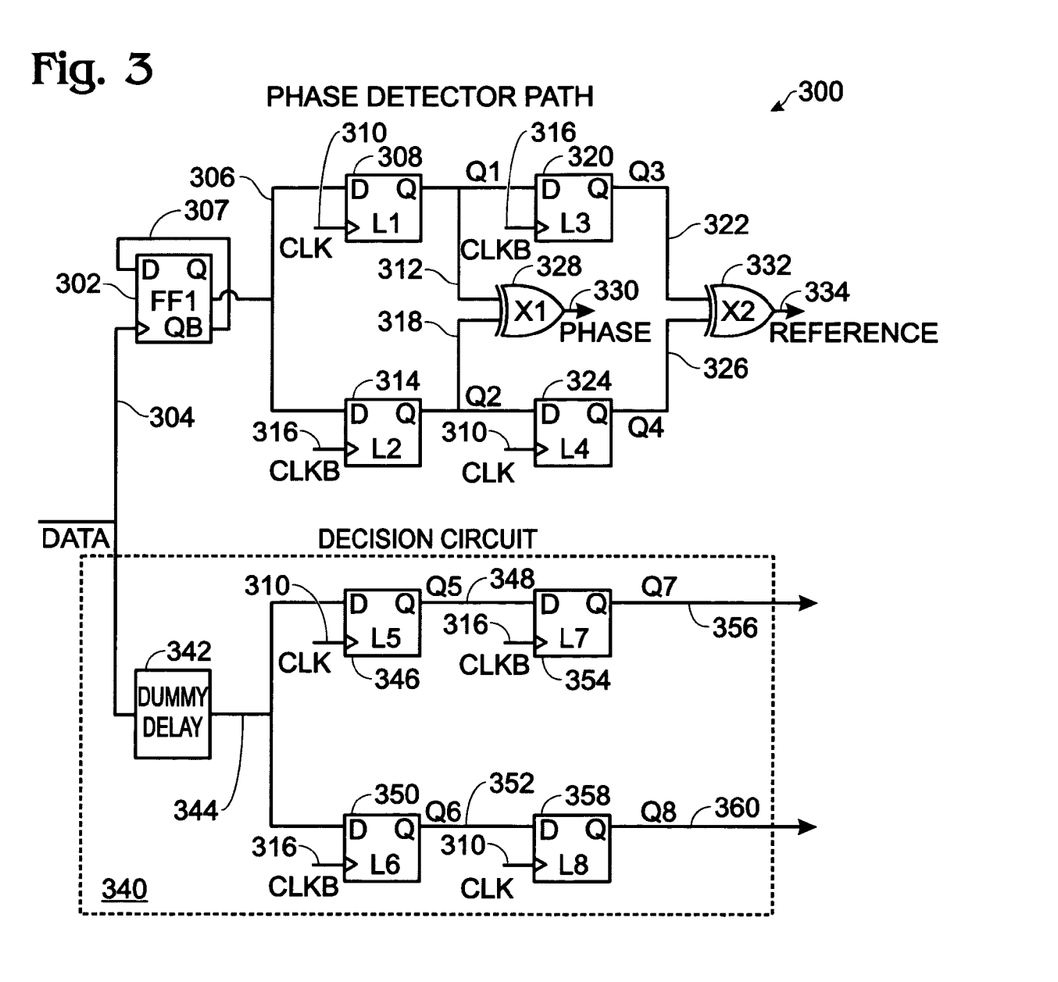
FIG. 3 is a schematic diagram of the present invention half-rate phase detector system with reduced data transition density.

FIG. 3 is a schematic diagram of the present invention half-rate phase detector system with reduced data transition density. The system 300 comprises a divide-by-two device 302 (FF1) having an input on line 304 to accept a stream of binary data and an output on line 306 to supply the data, divided by two. In some aspects of the system 300, the divide-by-two device 302 has a first processing delay. As shown, the divide-by-two device 302 is a D flip-flop having a clock input to receive the stream of digital data on line 304, a QB output on line 307 connected to the D input, and a Q output on line 306 to supply the divided data.

A first latch 308 (L1) has an input on line 306 connected to the divide-by-two device output, an input on line 310 to accept a first clock signal (CLK), and an output (Q1) on line 312 to supply the divided data latched by the first clock.

A second latch 314 (L2) has an input on line 306 connected to the divide-by-two output, an input on line 316 to accept a second clock signal (CLKB), the inverse of the first clock, and an output (Q2) on line 318 to supply the divided data latched by the second clock. A third latch 320 (L3) has an input on line 312 connected to the first latch output, an input to accept the second clock signal on line 316, and an output (Q3) on line 322 to supply the Q1 signal latched by the second clock. A fourth latch 324 (L4) has an input on line 318 connected to the second latch output, an input on line 310 to accept the first clock signal, and an output (Q4) on line 326 to supply the Q2 signal latched by the first clock.

A first exclusive-OR 328 (X1) has an input on line 312 to accept Q1, an input on line 318 to accept Q2, and an output on line 330 to supply a phase signal. A second XOR 332 (X2) has an input on line 322 to accept Q3, and input on line 326 to accept Q4, and an output on line 334 to supply a reference signal.

Some aspects of system 300 further comprise a decision circuit 340. The decision circuit 340 includes a delay buffer 342 (dummy delay) having an input on line 304 to accept the stream of binary data and an output on line 344 to supply the data with the first delay. A fifth latch 346 (L5) has an input on line 344 connected to the delay buffer output, an input on line 310 to accept the first clock signal, and an output (Q5) on line 348 to supply the delayed data latched by the first clock.

A sixth latch 350 (L6) has an input on line 344 connected to the delay buffer output, an input on line 316 to accept the second clock signal, and an output (Q6) on line 352 to supply the delayed data latched by the second clock. A seventh latch 354 (L7) has an input on line 348 connected to the fifth latch output, an input on line 316 to accept the second clock signal, and an output (Q7) on line 356 to supply the Q5 signal latched by the second clock. An eighth latch 358 (L8) has an input on line 352 connected to the sixth latch output, an input on line 310 to accept the first clock signal, and an output (Q8) on line 360 to supply the Q6 signal latched by the first clock.

In many applications the divide-by-two device 302 has an input (inputs) to accept a stream of differential binary data and an output (outputs) to supply differential data divided by two. The following is a description of the above-described circuit of FIG. 3 implemented differentially. Using the unbalanced input signal circuit as a model, it would be well within the power of one skilled in the art to build a differential version of the circuit.

Then, the divide-by-two device could be a differential D flip-flop having a differential clock inputs (CLKp and CLKn) to receive the stream of digital data, a Qn output connected to the positive D input (Dp) to supply divided data, and a Qp output connected to the negative D input (Dn) to supply the divided data.

The first latch would have an input connected to the divide-by-two output to accept the differential divided data and an output (Q1p and Q1n) to supply differential divided data latched by the first clock. The second latch would have an input connected to the divide-by-two output to accept the differential divided data and an output (Q2p and Q2n) to supply differential divided data latched by the second clock.

Likewise, the third latch would have an input connected to the first latch output to accept Q1p and Q1n signals and an output (Q3p and Q3n) to supply the differential Q1 signal latched by the second clock. The fourth latch would have an input connected to the second latch output to accept Q2p and Q2n and an output (Q4p and Q4n) to supply the differential Q2 signal latched by the first clock;

The first XOR would have an input to accept the differential Q1 and differential Q2 signals and an output to supply differential phase signals. Likewise, the second XOR would have an input to accept the differential Q3 and differential Q4 signals and an output to supply differential reference signals.

Likewise, the decision circuit 340 can be implemented differentially. The delay buffer would have an input to accept a stream of differential binary data and an output to supply delayed differential data. The fifth latch would have an input connected to the delay buffer output to accept the differential divided data and an output (Q5p and Q5n) to supply differential divided data latched by the first clock. The sixth latch would have an input connected to the dummy delay output to accept the differential divided data and an output (Q6p and Q6n) to supply differential divided data latched by the second clock;

The seventh latch would have an input connected to the fifth latch output to accept Q5p and Q5n signals and an output (Q7p and Q7n) to supply the differential Q5 signal latched by the second clock. The eighth latch would have an input connected to the sixth latch output to accept Q6p and Q6n and an output (Q8p and Q8n) to supply the differential Q6 signal latched by the first clock.

Figure 4:
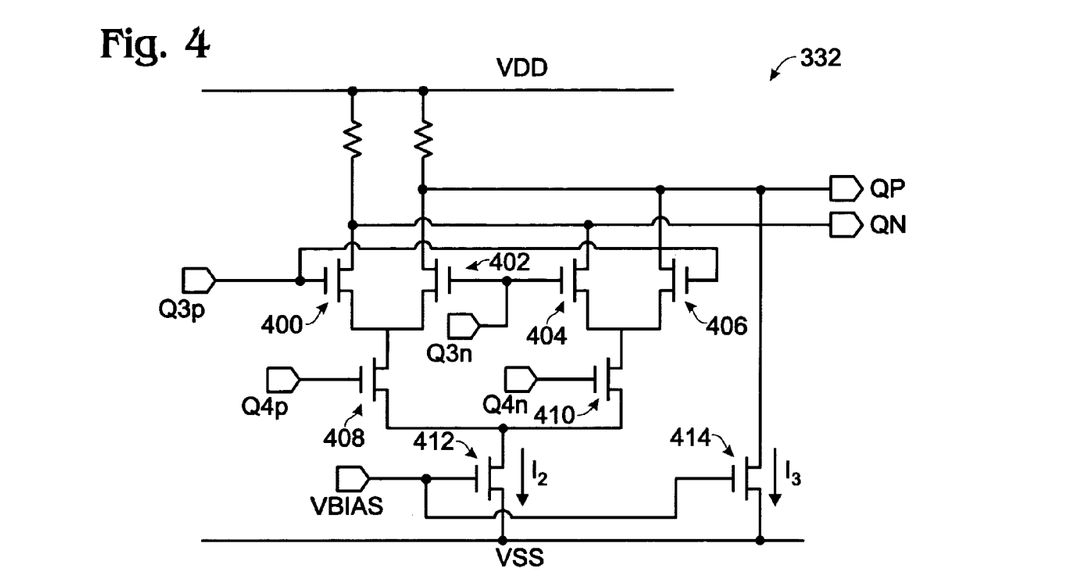
FIG. 4 is a detailed schematic diagram of the second XOR of FIG. 3, implemented differentially.

FIG. 4 is a detailed schematic diagram of the second XOR 332 of FIG. 3, implemented differentially. The second XOR 332 includes a first differential pair of transistors 400 and 402. First transistor 400 has a gate to accept Q3p. Second transistor 402 has a gate to accept Q3n. With respect to FIG. 3, Q3p and Q3n are a differential version of the signal on line 322. The source of the first transistor 400 supplies a reference signal QP. The source of the second transistor 402 supplies a reference signal QN. With respect to FIG. 3, QP and QN are a differential version of the signals on line 334.

The second XOR 332 includes a second differential pair of transistors 404 and 406. Third transistor 404 has a gate to accept Q3n. Fourth transistor 406 has a gate to accept Q3p. The source of third transistor 404 is connected to the first transistor source. The source of transistor 406 is connected to the second transistor source.

A fifth transistor 408 has a drain connected to the sources of the first differential pair (400 and 402) and a gate to receive the Q4p signal. A sixth transistor 410 has a drain connected to the sources of the second differential pair (404 and 406) and a gate to receive the Q4n signal. With respect to FIG. 3, Q4n and Q4p are a differential version of the signals on line 326.

A seventh transistor 412 having a drain connected to the sources of the fifth and sixth transistors 408/410, and a gate to accept a voltage bias signal (Vbias). An eighth transistor 414 has a drain connected to the second transistor 402 source and a gate to accept the voltage bias signal. The seventh transistor passes current I2 and the eighth transistor 414 passes drain current I3.

Figure 5:
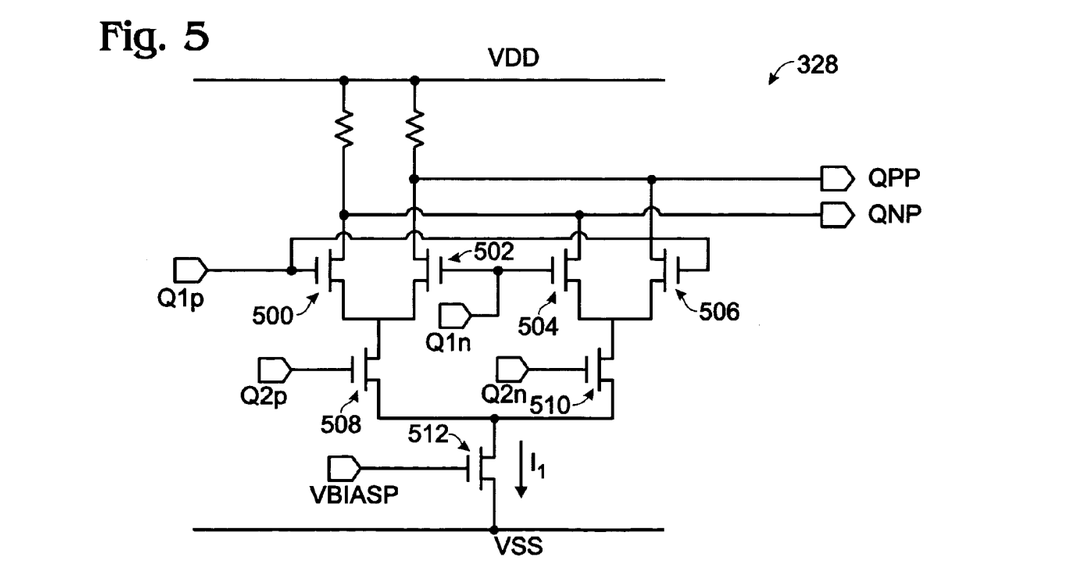
FIG. 5 is a detailed schematic diagram of the first XOR of FIG. 3, implemented differentially.

FIG. 5 is a detailed schematic diagram of the first XOR 328 of FIG. 3, implemented differentially. The first XOR 328 includes a third differential pair of transistors 500 and 502. The ninth transistor 500 gate accepts Q1p. The tenth transistor 502 has a gate to accept Q1n. The ninth transistor source supplies a phase signal QPP and the tenth transistor source supplies the phase signal QNP. With respect to FIG. 3, Q1P and Q1N are a differential version of the signals on line 312 and QPP and QNP are differential versions of the signal on line 330.

A fourth differential pair of transistors (504 and 506) is included. The eleventh transistor 504 has a gate to accept Q1n. The twelfth transistor 506 has a gate to accept Q1p. The eleventh transistor source is connected to the ninth transistor source and the twelfth transistor source is connected to the tenth transistor source.

A thirteenth transistor 508 having a drain connected to the sources of the third differential pair (500 and 502) and a gate to receive the Q2p signal. A fourteenth transistor 510 has a drain connected to the sources of the fourth differential pair (504 and 506) and a gate to receive the Q2n signal. A fifteenth transistor 512 has a drain connected to the sources of the thirteenth and fourteenth transistors (508 and 510), and a gate to accept a voltage bias signal (VbiasP). The fifteenth transistor 512 passes current I1.

Considering FIGS. 4 and 5 together, the current through the seventh transistor 412 and eighth transistor 414 (I2 and I3) of the second XOR 332 is approximately equal to the current through the fifteenth transistor 512 (I1) of the first XOR 328.

FUNCTIONAL DESCRIPTION

Figure 6:
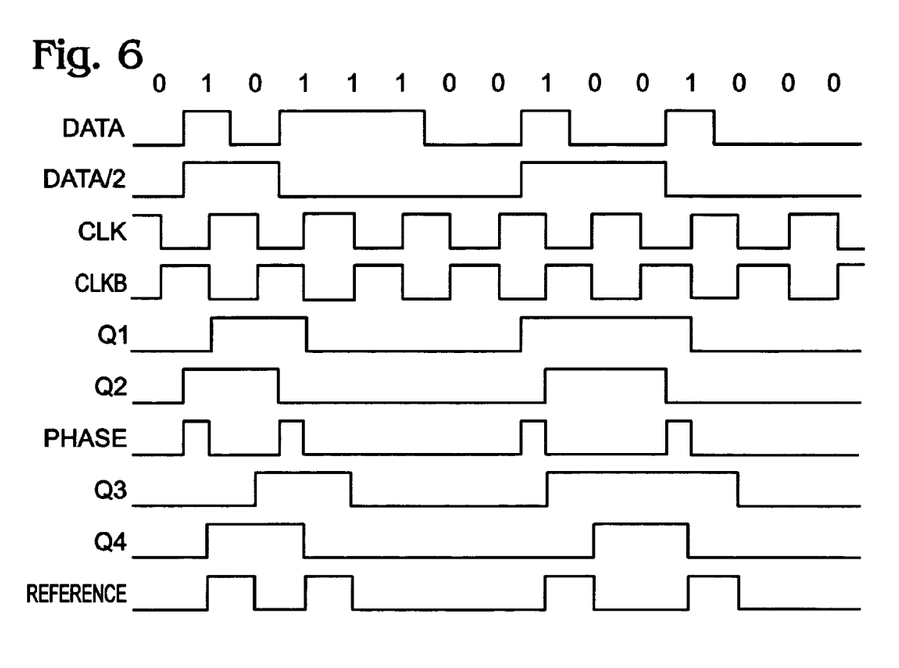
FIG. 6 is a timing diagram illustrating the operation of the circuit of FIG. 3.

FIG. 6 is a timing diagram illustrating the operation of the circuit of FIG. 3. In the present invention phase detector path, the data is initially divided by 2. Therefore, data transition density is cut in half. When the loop is locked, the output of latches L1 and L2 (Q1 and Q2) have a width that is always equal to, or longer than two full-rate clock periods. Even in an unlocked situation, the shortest pulses are still equal to, or longer than one full-rate clock period. Therefore, output of the latches can easily reach full swing and be handled by the XORs. As a result, an associated phase detector will have good zero-crossings, small data pattern dependent zero crossing offsets, and a wider linear range.

Contrasting FIGS. 2 and 6, it can be seen that the XOR generated phase and reference pulses are very narrow in both architectures. Typically, this is not a severe problem, because these signals are low-pass filtered to remove high frequency components of signals. However, if the phase and reference signals do not reach full swing, the phase detector gain can be affected. Even so, the speed of XOR has minor effect on the width of phase detector linear region.

With respect to FIG. 6, information is lost when the input signal is divided by 2 in the phase detector path. Therefore, the decision circuit is used to demultiplex the incoming data. A delay buffer is used to match the delay of the divide-by-two circuit in the phase detector path.

Figure 7:
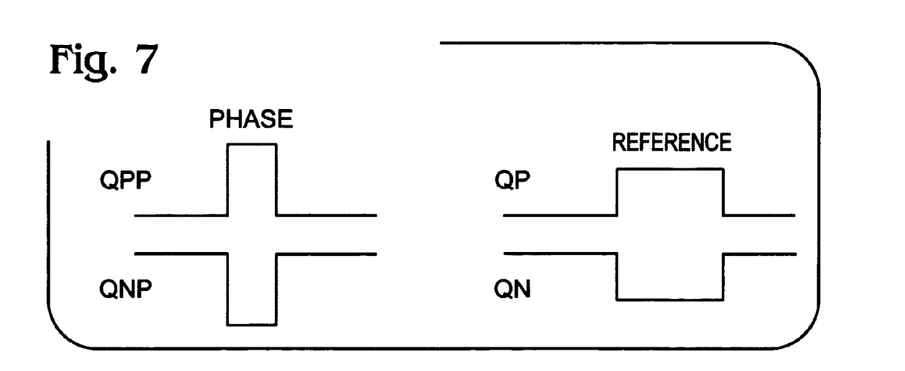
FIG. 7 is a timing diagram illustrating the outputs of the first and second XORs of FIGS. 5 and 4, respectively.

FIG. 7 is a timing diagram illustrating the outputs of the first and second XORs of FIGS. 5 and 4, respectively. As mentioned above, the pulses in phase signal are only half as wide as the reference signal. To cut the reference signal by half differentially, a unique reference signal (second) XOR is required. The current of reference signal XOR is reduced by half, making $I_1=2I_2=2I_3$. The integration of this differential reference signal should be then equal the phase signal. By keeping $I_1=I_2+I_3$, and adjusting current ratio of $I_2$ and $I_3$, clock sampling position can be placed either at the center of data eye, or offset for different applications. For example, flip-flops generally have positive setup and negative hold time requirement. To offset this limitation, the current can be adjusted so that sampling clock occurs a little bit to the right (delayed) of the data eye center. In another example, the sampling position can be offset to the left of the eye center to accommodate return-to-zero (RZ) input data.

Figure 8:
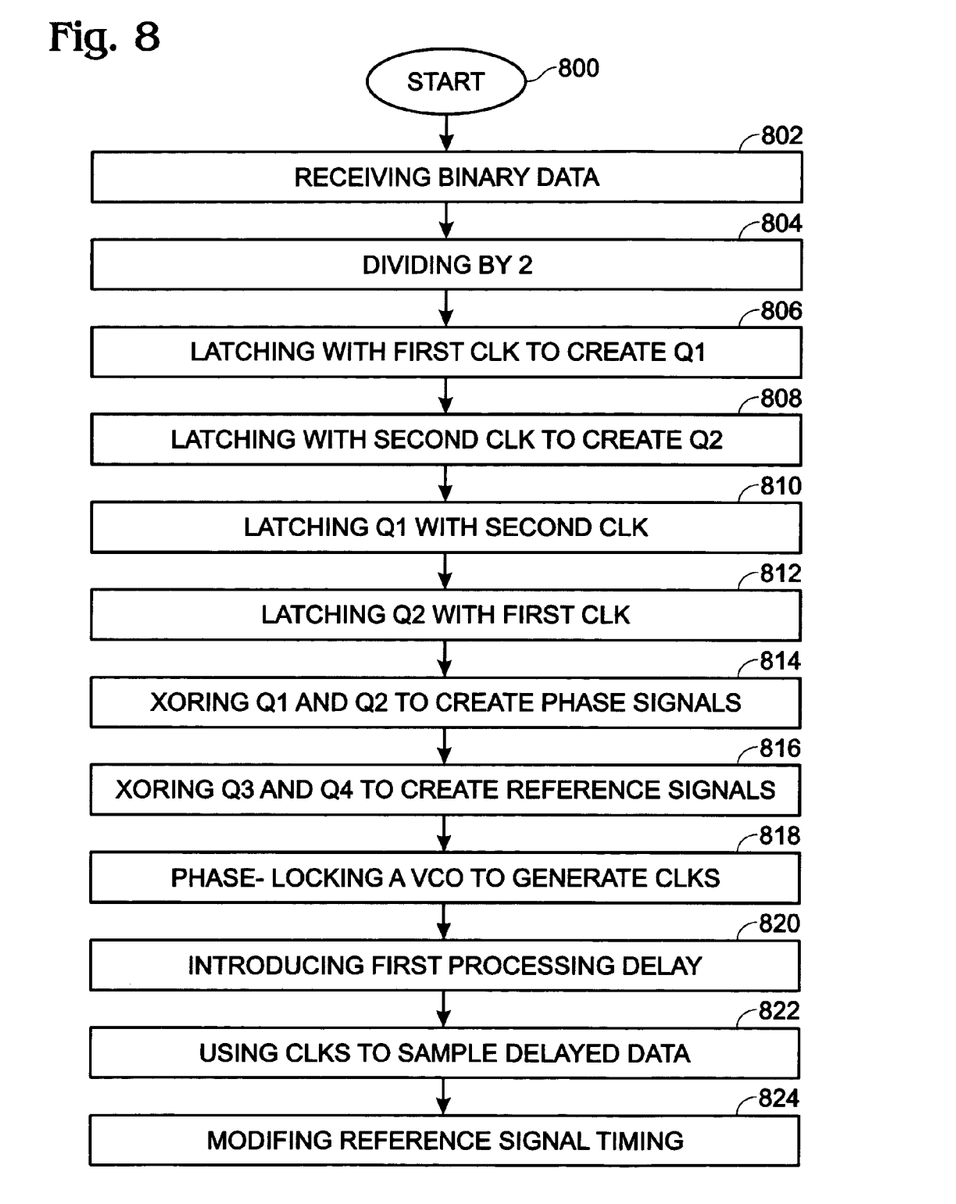
FIG. 8 is a flowchart illustrating the present invention half-rate phase detecting method.

FIG. 8 is a flowchart illustrating the present invention half-rate phase detecting method. Although the method is depicted as a sequence of numbered steps for clarity, no order should be inferred from the numbering unless explicitly stated. It should be understood that some of these steps may be skipped, performed in parallel, or performed without the requirement of maintaining a strict order of sequence. The method starts at Step 800.

Step 802 receives a stream of binary data. Step 804 divides the data by two. Step 806 latches the divided data with a first half-rate clock, creating a first latch output Q1. Step 808 latches the divided data with a second half-rate clock, the inverse of the first clock, creating a second latch output Q2. Step 810 latches Q1 with the second clock, creating a third latch output Q3. Step 812 latches Q2 with the first clock, creating a fourth latch output Q4. Step 814 performs an exclusive-OR operation on Q1 and Q2 to create phase signals. Step 816 performs an exclusive-OR operation on Q3 and Q4 to create reference signals, corresponding to the phase signals.

In some aspects of the method, creating phase signals in Step 814 includes creating phase signals having a first width. Then, creating reference signals, corresponding to the phase signals, in Step 816 includes creating reference signals with a second width, twice the first width.

In other aspects, receiving a stream of binary data in Step 802 includes receiving a stream of differential binary data. Dividing the data by two in Step 804 includes dividing the differential data steam by two. Creating output Q1 in Step 806 includes creating differential outputs Q1p and Q1n, the inverse of Q1p. Creating output Q2 in Step 808 includes creating differential outputs Q2p and Q2n, the inverse of Q2p. Creating output Q3 in Step 810 includes creating differential outputs Q3p and Q3n, the inverse of Q3p. Creating output Q4 in Step 812 includes creating differential outputs Q4p and Q4n, the inverse of Q4p. Performing an exclusive-OR operation on Q1 and Q2 to create phase signals in Step 814 includes performing exclusive-OR operations on the Q1 and Q2 differential outputs to create differential phase signal outputs. Performing an exclusive-OR operation on Q3 and Q4 to create reference signals in Step 816 includes performing exclusive-OR operations on the Q3 and Q4 differential outputs to create differential reference signal outputs.

In some aspects, dividing the stream of data by two in Step 804 includes introducing a first processing delay into the divided data. Then, the method may comprise further steps. Step 818, in response to the phase and reference signals, phase-locks a voltage controlled oscillator (VCO) to generate the first and second clocks. Step 820 delays the received stream of binary data a period of time equal to the first processing delay. Step 822 uses the first and second clocks to sample the delayed binary data.

In other aspects, receiving a stream of binary data in Step 802 includes receiving binary data pulses. Then, the method comprises an additional step. Step 824 modifies the timing of the reference signals with respect to the phase signals. Then, using the first and second clocks to sample the received data in Step 822 includes changing the binary data pulse sampling position in response to the modified reference signals.

A half-clock phase detection system and method have been presented. Some specific circuits have been depicted to illustrate the invention. Likewise, some particular uses for the invention have been mentioned to illustrate some advantages of the invention. However, other variations and embodiments of the invention will occur to those skilled in the art.

We claim:

1. A half-rate phase detecting method, the method comprising:
   receiving a stream of binary data;
   dividing the data by two;
   latching the divided data with a first half-rate clock, creating a first latch output Q1;
   latching the divided data with a second half-rate clock, the inverse of the first clock, creating a second latch output Q2;
   latching Q1 with the second clock, creating a third latch output Q3;
   latching Q2 with the first clock, creating a fourth latch output Q4;
   performing an exclusive-OR operation on Q1 and Q2 to create phase signals having a first width; and,
   performing an exclusive-OR operation on Q3 and Q4 to create reference signals, corresponding to the phase signals, having a second width that is twice the first width.

2. The method of claim 1 wherein receiving a stream of binary data includes receiving a stream of differential binary data;
   wherein dividing the data by two includes dividing the differential data steam by two;
   wherein creating output Q1 includes creating differential outputs Q1p and Q1n, the inverse of Q1p;
   wherein creating output Q2 includes creating differential outputs Q2p and Q2n, the inverse of Q2p;
   wherein creating output Q3 includes creating differential outputs Q3p and Q3n, the inverse of Q3p;
   wherein creating output Q4 includes creating differential outputs Q4p and Q4n, the inverse of Q4p;
   wherein performing an exclusive-OR operation on Q1 and Q2 to create phase signals includes performing exclusive-OR operations on the Q1 and Q2 differential outputs to create differential phase signal outputs; and,
   wherein performing an exclusive-OR operation on Q3 and Q4 to create reference signals includes performing exclusive-OR operations on the Q3 and Q4 differential outputs to create differential reference signal outputs.

3. The method of claim 1 wherein dividing the stream of data by two includes introducing a first processing delay into the divided data;
   the method further comprising:
   in response to the phase and reference signals, phase-locking a voltage controlled oscillator to generate the first and second clocks;
   delaying the received stream of binary data a period of time equal to the first processing delay; and,
   using the first and second clocks to sample the delayed binary data.

4. The method of claim 3 wherein receiving a stream of binary data includes receiving binary data pulses;
   the method further comprising:
   modifying the timing of the reference signals with respect to the phase signals; and,
   wherein using the first and second clocks to sample the received data includes changing the binary data pulse sampling position in response to the modified reference signals.

5. A half-rate phase detector system with reduced data transition density, the system comprising:
   a divide-by-two device D flip-flop having a clock input to accept a stream of binary data, a QB output connected to the D input, and a Q output to supply the data, divided by two;
   a first latch (L1) having an input connected to the divide-by-two device output, an input to accept a first clock signal, and an output (Q1) to supply the divided data latched by the first clock;
   a second latch (L2) having an input connected to the divide-by-two output, an input to accept a second clock signal, the inverse of the first clock, and an output (Q2) to supply the divided data latched by the second clock;
   a third latch (L3) having an input connected to the first latch output, an input to accept the second clock signal, and an output (Q3) to supply the Q1 signal latched by the second clock;
   a fourth latch (L4) having an input connected to the second latch output, an input to accept the first clock signal, and an output (Q4) to supply the Q2 signal latched by the first clock;
   a first exclusive-OR (XOR) (X1) having an input to accept Q1, an input to accept Q2, and an output to supply a phase signal; and,
   a second XOR (X2) having an input to accept Q3, and input to accept Q4, and an output to supply a reference signal.

6. The system of claim 5 wherein the divide-by-two device has a first processing delay;
   the system further comprising:
   a decision circuit including:
   a delay buffer having an input to accept the stream of binary data and an output to supply the data with the first delay;
   a fifth latch (L5) having an input connected to the delay buffer output, an input to accept the first clock signal, and an output (Q5) to supply the delayed data latched by the first clock;
   a sixth latch (L6) having an input connected to the delay buffer output, an input to accept the second clock signal, and an output (Q6) to supply the delayed data latched by the second clock;
   a seventh latch (L7) having an input connected to the fifth latch output, an input to accept the second clock signal, and an output (Q7) to supply the Q5 signal latched by the second clock; and,
   an eighth latch (L8) having an input connected to the sixth latch output, an input to accept the first clock signal, and an output (Q8) to supply the Q6 signal latched by the first clock.

7. The system of claim 5 wherein the divide-by-two device has an input to accept a stream of differential binary data and an output to supply differential data divided by two;
   wherein the first latch has an input connected to the divide-by-two output to accept the differential divided data and an output (Q1p and Q1n) to supply differential divided data latched by the first clock;
   wherein the second latch has an input connected to the divide-by-two output to accept the differential divided data and an output (Q2p and Q2n) to supply differential divided data latched by the second clock;
   wherein the third latch has an input connected to the first latch output to accept Q1p and Q1n signals and an output (Q3p and Q3n) to supply the differential Q1 signal latched by the second clock;

wherein the fourth latch has an input connected to the second latch output to accept Q2p and Q2n and an output (Q4p and Q4n) to supply the differential Q2 signal latched by the first clock;

wherein the first XOR has an input to accept the differential Q1 and differential Q2 signals and an output to supply differential phase signals; and, wherein the second XOR has an input to accept the differential Q3 and differential Q4 signals and an output to supply differential reference signals.

8. The system of claim 7 wherein the delay buffer has an input to accept a stream of differential binary data and an output to supply delayed differential data;

wherein the fifth latch has an input connected to the delay buffer output to accept the differential divided data and an output (Q5p and Q5n) to supply differential divided data latched by the first clock;

wherein the sixth latch has an input connected to the delay buffer output to accept the differential divided data and an output (Q6p and Q6n) to supply differential divided data latched by the second clock;

wherein the seventh latch has an input connected to the fifth latch output to accept Q5p and Q5n signals and an output (Q7p and Q7n) to supply the differential Q5 signal latched by the second clock; and, wherein the eighth latch has an input connected to the sixth latch output to accept Q6p and Q6n and an output (Q8p and Q8n) to supply the differential Q6 signal latched by the first clock.

9. The system of claim 7 wherein the divide-by-two device is a differential D flip-flop having a differential clock inputs (CLKp and CLKn) to receive the stream of digital data, a Qn output connected to the positive D input (Dp) to supply divided data, and a Qp output connected to the negative D input (Dn) to supply the divided data.

10. The system of claim 7 wherein the second XOR includes:
   a first differential pair of transistors, with a first transistor gate to accept Q3p, a second transistor gate to accept Q3n, a first transistor source to supply a reference signal QP, and a second transistor source to supply a reference signal QN;
   a second differential pair of transistors, with a third transistor gate to accept Q3n, a fourth transistor gate to accept Q3p, a third transistor source connected to the first transistor source, and a fourth transistor source connected to the second transistor source;
   a fifth transistor having a drain connected to the sources of the first differential pair and a gate to receive the Q4p signal;
   a sixth transistor having a drain connected to the sources of the second differential pair and a gate to receive the Q4n signal;
   a seventh transistor having a drain connected to the sources of the fifth and sixth transistors, and a gate to accept a voltage bias signal (Vbias); and,
   an eighth transistor having a drain connected to the second source and a gate to accept the voltage bias signal.

11. The system of claim 10 wherein the first XOR includes:
   a third differential pair of transistors, with a ninth transistor gate to accept Q1p, a tenth transistor gate to accept Q1n, a ninth transistor source to supply a phase signal QPP, and a tenth transistor source to supply the phase signal QNP;
   a fourth differential pair of transistors, with an eleventh transistor gate to accept Q1n, a twelfth transistor gate to accept Q1p, an eleventh transistor source connected to the ninth transistor source, and a twelfth transistor source connected to the tenth transistor source;
   a thirteenth transistor having a drain connected to the sources of the third differential pair and a gate to receive the Q2p signal;
   a fourteenth transistor having a drain connected to the sources of the fourth differential pair and a gate to receive the Q2n signal;
   a fifteenth transistor having a drain connected to the sources of the thirteenth and fourteenth transistors, and a gate to accept a voltage bias signal (VbiasP).

12. The system of claim 11 wherein the current through the seventh and eighth transistors of the second XOR is approximately equal to the current through the fifteenth transistor of the first XOR.

13. A half-rate phase detecting method, the method comprising:
   receiving a stream of binary data;
   dividing the data by two and introducing a first processing delay;
   latching the divided data with a first half-rate clock, creating a first latch output Q1;
   latching the divided data with a second half-rate clock, the inverse of the first clock, creating a second latch output Q2;
   latching Q1 with the second clock, creating a third latch output Q3;
   latching Q2 with the first clock, creating a fourth latch output Q4;
   performing an exclusive-OR operation on Q1 and Q2 to create phase signals;
   performing an exclusive-OR operation on Q3 and Q4 to create reference signals, corresponding to the phase signals;
   in response to the phase and reference signals, phase-locking a voltage controlled oscillator to generate the first and second clocks;
   delaying the received stream of binary data a period of time equal to the first processing delay; and,
   using the first and second clocks to sample the delayed binary data.

* * * * *